US011017857B2

(12) United States Patent
Gyllenskog (10) Patent No.: US 11,017,857 B2
(45) Date of Patent: May 25, 2021

(54) RANGED CONTENT-ADDRESSABLE MEMORY

(71) Applicant: Micron Technology, Inc., Boise, ID (US)

(72) Inventor: Christian M Gyllenskog, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/511,462

(22) Filed: Jul. 15, 2019

(65) Prior Publication Data

US 2021/0020246 A1 Jan. 21, 2021

(51) Int. Cl.
*G06F 12/10* (2016.01)
*G11C 15/00* (2006.01)

(52) U.S. Cl.
CPC .............. *G11C 15/00* (2013.01); *G06F 12/10* (2013.01); *G06F 2212/657* (2013.01)

(58) Field of Classification Search
CPC ............................ G06F 11/1064; G06F 12/10
USPC ................................................. 711/108, 202
See application file for complete search history.

(56) References Cited

U.S. PATENT DOCUMENTS

| 6,240,003 | B1 | 5/2001 | Mcelroy | |
|---|---|---|---|---|
| 6,906,938 | B2 | 6/2005 | Kaginele | |
| 7,035,968 | B1* | 4/2006 | Pereira | G11C 15/00 707/999.006 |
| 7,272,684 | B1* | 9/2007 | Chou | G11C 15/00 711/108 |
| 7,555,594 | B2* | 6/2009 | Venkatachary | G11C 15/00 365/49.1 |
| 8,169,808 | B2 | 5/2012 | Roohparvar | |
| 2002/0007446 | A1* | 1/2002 | Stark | G11C 15/00 711/158 |
| 2003/0028657 | A1* | 2/2003 | Thunquest | H04L 12/185 709/230 |
| 2003/0093646 | A1* | 5/2003 | Stark | G11C 15/00 711/219 |
| 2003/0131187 | A1* | 7/2003 | Stark | G06F 16/90339 711/108 |

(Continued)

FOREIGN PATENT DOCUMENTS

KR 20080050246 6/2008

OTHER PUBLICATIONS

"International Application Serial No. PCT US2020 041073, International Search Report dated Oct. 21, 2020", 3 pgs.

(Continued)

*Primary Examiner* — Than Nguyen
(74) *Attorney, Agent, or Firm* — Schwegman Lundberg & Woessner, P.A.

(57) ABSTRACT

A memory device comprises a block of ranged content-addressable memory (RCAM) including multiple RCAM memory elements, wherein each RCAM memory element is accessed by content that includes two values; a search register configured to store a search value; and logic circuitry coupled to the multiple content-addressable memory elements and the search register. The logic circuitry is configured to: compare the search value of the search register to the two values of each of the multiple RCAM memory elements in parallel; and identify an RCAM memory element according to the comparison.

18 Claims, 6 Drawing Sheets

(56) References Cited

U.S. PATENT DOCUMENTS

| | | | |
|---|---|---|---|
| 2004/0019737 A1* | 1/2004 | Kastoriano | G06F 16/283 |
| | | | 711/104 |
| 2006/0047719 A1* | 3/2006 | Hershkovich | G06F 16/2272 |
| 2010/0293327 A1* | 11/2010 | Lin | H04L 45/7457 |
| | | | 711/108 |
| 2014/0050002 A1 | 2/2014 | Sun | |
| 2018/0301192 A1 | 10/2018 | Louie et al. | |
| 2019/0087229 A1* | 3/2019 | Iuliano | G06F 9/505 |

OTHER PUBLICATIONS

"International Application Serial No. PCT US2020 041073, Written Opinion dated Oct. 21, 2020", 6 pgs.

* cited by examiner

RANGED CONTENT-ADDRESSABLE MEMORY

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc. SSD, UFS, and eMMC devise can be managed NAND (M-NAND) memory devices that include processing circuitry such as memory controllers, direct memory access (DMA) controllers, and flash memory interface circuitry to manage the access to physical memory.

A memory system can include one or more processors or other memory controllers performing logic functions to operate the memory devices or interface with external systems. In an addressed memory system, data is written to and read from specified addresses. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

A content-addressable memory (CAM) is a memory device that permits memory searching according to the stored content of memory cells when the physical address of the data content is unknown. A CAM device can provide rapid parallel searching of stored data to find a particular data value. In contrast to an addressed memory device (e.g., RAM), which are based on address-driven storage architectures, a CAM memory device may provide both address-driven and content-driven data access.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). The storage device may include CAM memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Data stored in a CAM memory device can be accessed according to either address or content. In a content-driven data retrieval, a data pattern is presented to the CAM memory device. If the CAM memory device contains data with the same data pattern, an address where the data pattern is stored is returned by the CAM device. The CAM memory device can be structured to perform the content-driven search on a highly parallel basis, conducting the search on all the data in the CAM substantially simultaneously. Consequently, a CAM can provide search results much more rapidly than an address-driven memory device, in which searches are typically performed serially, one address at a time. However, the CAM memory device performs a search for a specific bit-pattern within the set of memory addresses. This approach is very fast for finding known values, but a new search is performed for every bit-pattern of interest. As a result, some examples described herein include various structures and methods for searching for a range of bit patterns in a single content-driven search.

Figure 1:
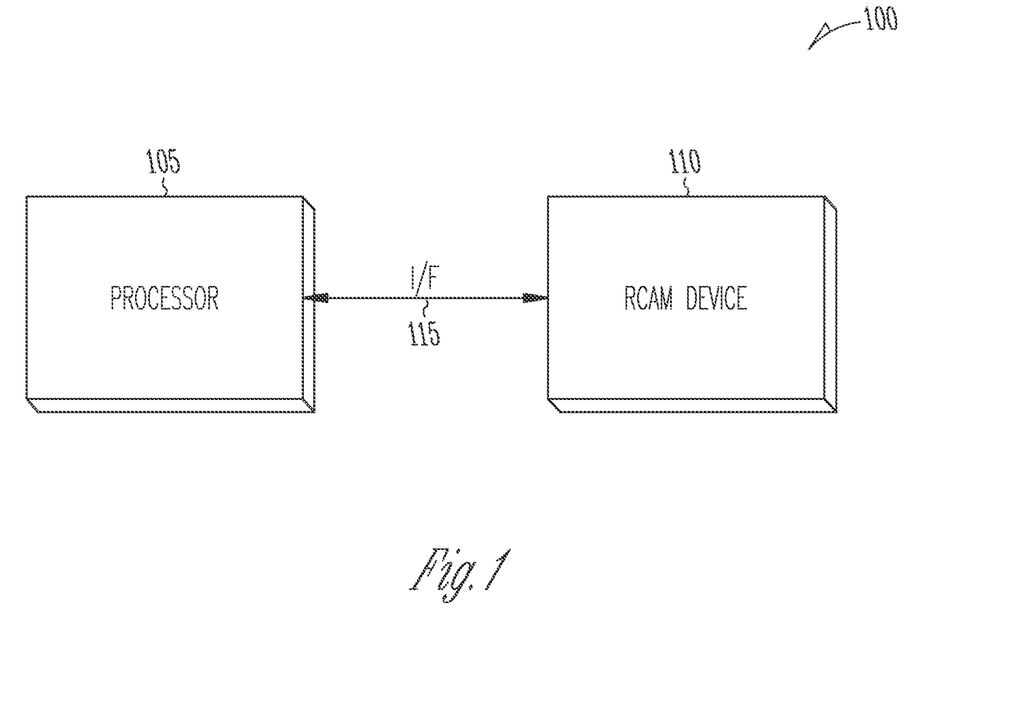
FIG. 1 illustrates an example system including a processor and a ranged content-addressable memory.

FIG. 1 illustrates an example system 100 including a processor 105 and a ranged content-addressable memory (RCAM) device 110. The processor 105 can include a central processing unit, or one or more other device, processor, or controller. The processor 105 and the RCAM device 110 may communicate using a communication interface (I/F) 115 (e.g., a bidirectional parallel or serial communication interface). The RCAM device 110 can include one or more blocks of content-addressable memory elements. The RCAM device 110 provides content-driven data retrieval. To perform a content-driven search, the processor 105 sends data to the RCAM device 110 and the RCAM device 110 returns an address or other identifier associated with the data.

Figure 2:
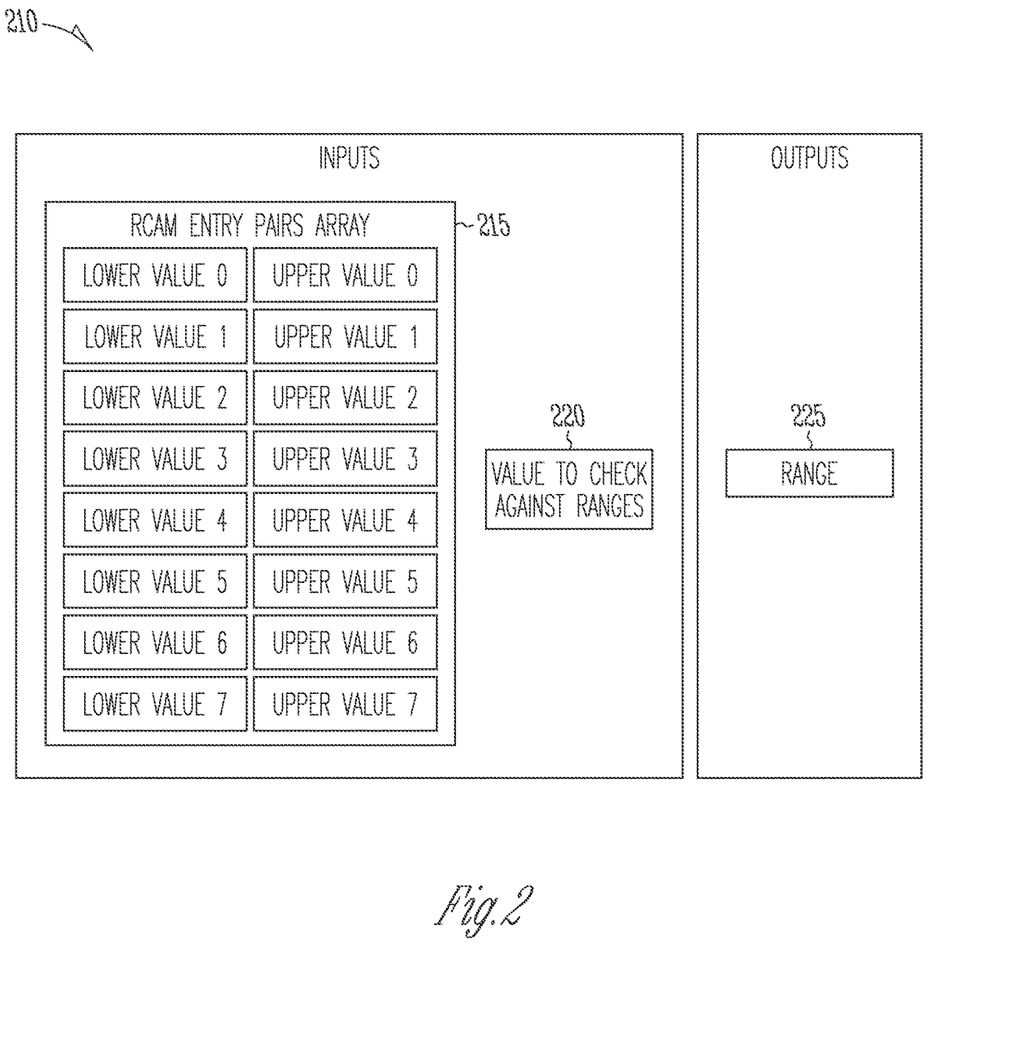
FIG. 2 is a block diagram of an example of portions of ranged content-addressable memory.

FIG. 2 is a block diagram of an example of portions of an RCAM 210. The RCAM 210 includes a content-addressable memory array 215 of memory elements. Different from a conventional CAM, each of the memory elements of the RCAM device 210 stores two values (e.g., two storage words) that define a range of values. In the example of FIG.

2, each of memory elements 0-7 stores a lower value and an upper that together define a range. Only 8 memory elements are shown in FIG. 2 to simplify the diagram. An actual implementation of the RCAM may have many thousands of memory elements. The data received from the host can be a search value 220 to check against the ranges of the memory elements. The search value is used to perform a parallel search of the one or more blocks of memory elements of the RCAM 210. The search value 220 is compared to the two values of each memory element a positive result is returned when the search value is within a range defined by the two values of a memory element. The output 225 of the content search can be an address of the memory element containing a range that includes the search value, or the output can be the value of the range itself.

Figure 3:
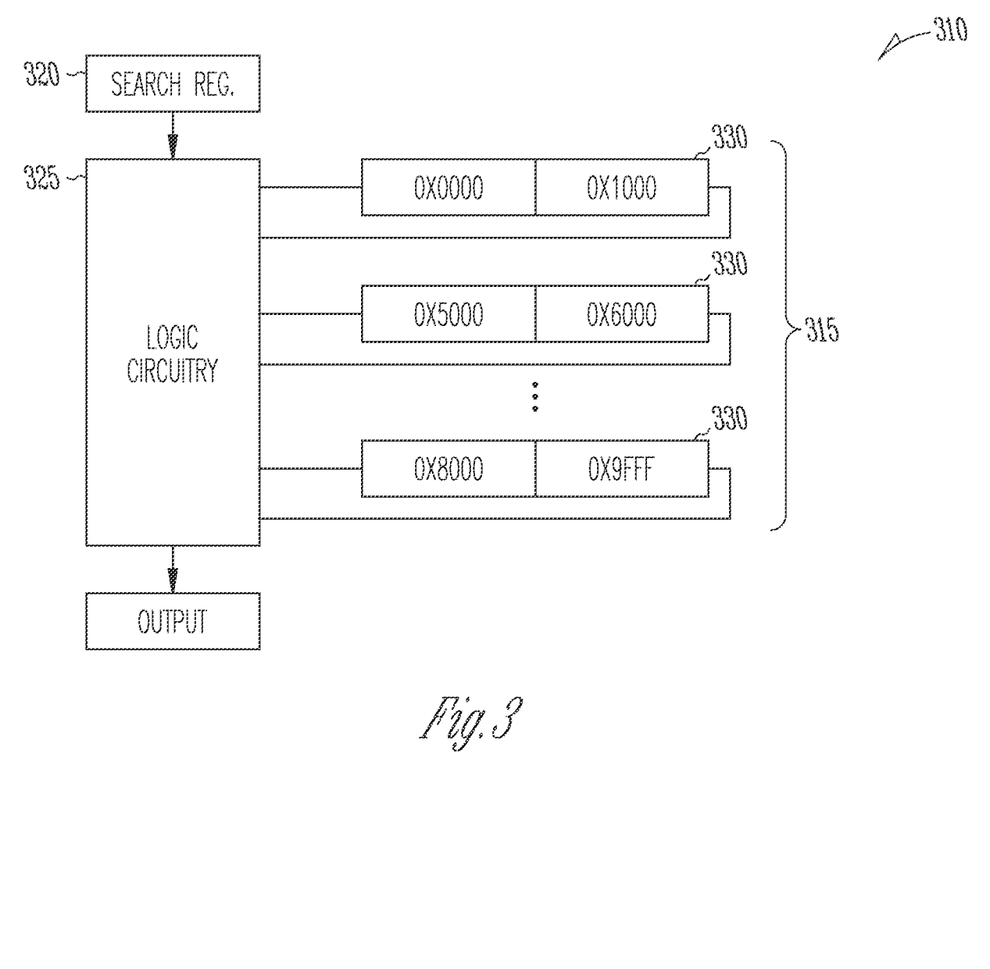
FIG. 3 is block diagram of portions of an example of a ranged content-addressable memory device.

FIG. 3 is block diagram of portions of an example of an RCAM device 310. The RCAM device 310 includes one or more blocks of RCAM 315, a search register 320, and logic circuitry 325. Each RCAM block includes multiple RCAM memory elements 330. Each RCAM memory element 330 is accessed by its content which includes two values. The search register 320 is to store the search value 220 in FIG. 2. The logic circuitry 325 compares the search value of the search register 320 to the two values of each of the multiple RCAM memory elements in parallel and identifies an RCAM memory element according to the results of the comparison. The RCAM memory element (or elements) can be identified using an address of the RCAM memory element or an index (e.g., from a base address) that identifies the RCAM memory element.

In some examples, the two values of an RCAM memory element are a lower bound value and an upper bound value. The logic circuitry 325 compares the search value parallel to all the lower bound and upper bound values to see if the search value falls between each element's two values. The logic circuitry 325 finds the range that includes the search value and returns an address of the RCAM memory element or elements for the range or ranges determined by the lower bound value and the upper bound values of the RCAM memory elements. In these embodiments, the logic circuitry may perform the logic function TRUE=(Lower Value≤[Search Value])&&([Search Value]<Upper Value).

In some examples, the two values of an RCAM memory element are a base value and an offset value. The base value and the offset value can determine a range of values, such as the range values within the offset from the base value. In these embodiments, the logic circuitry performs the logic function TRUE=(Base≤[Search Value])&&([Search Value]<(Base+Offset)).

The logic circuitry 325 determines the RCAM memory elements with a range that includes the search value and returns the address of the RCAM memory element or elements.

Figure 4:
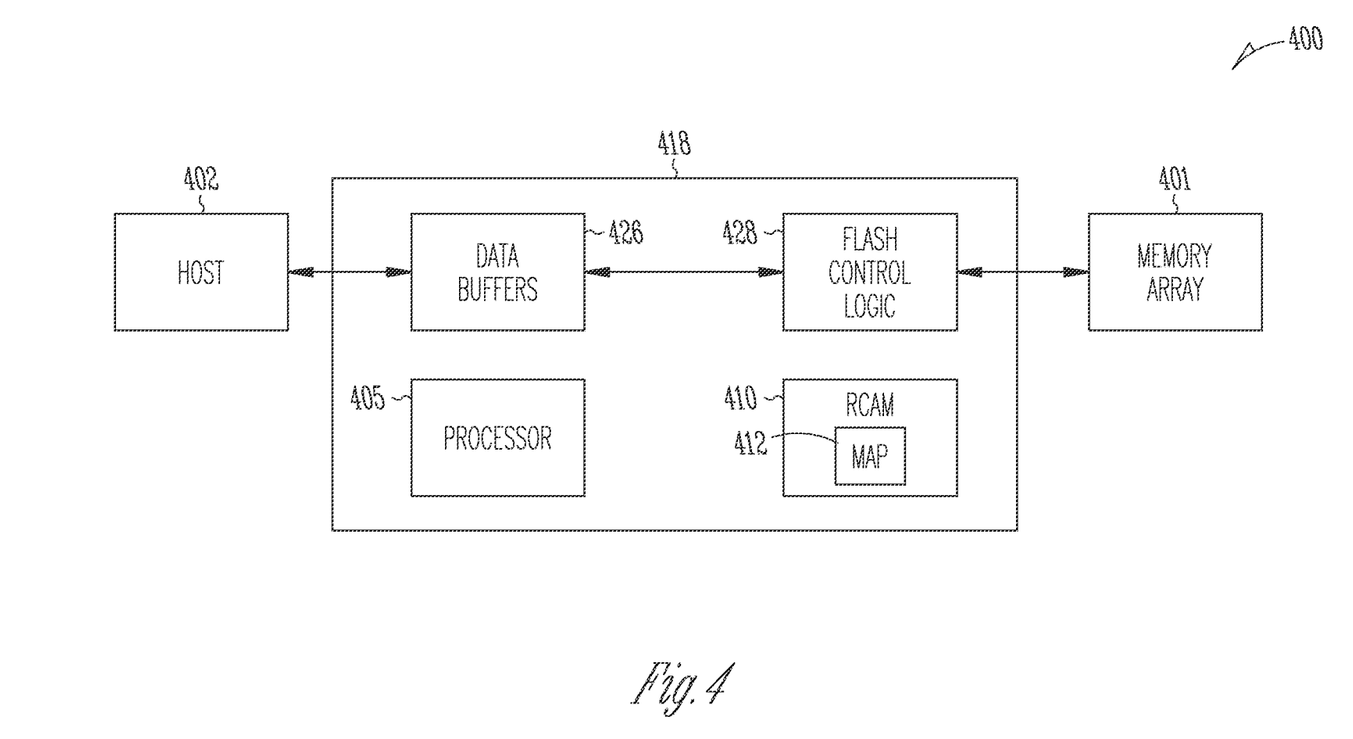
FIG. 4 is a block diagram of an electronic system that includes ranged content-addressable memory.

FIG. 4 is a block diagram of an electronic system 400 that includes a host device 402, a memory control unit 418, and a memory array 401 or multiple memory arrays containing memory cells. The host device 402 can include a central processing unit, or one or more other device, processor, or controller. The memory array 401 can be a flash memory array, such as a NAND flash (e.g., 3-dimensional (3-D) NAND) or a NOR flash memory array, or another kind of memory array, such as a variable resistance memory array (e.g., a phase change memory or a resistive RAM array).

The memory control unit 418 can include components such as a processor 405, or a state machine, register circuits, and other components to control memory operations (e.g., read, write, and erase operations) of memory array 401 based on control signals. Examples of the control signals include one or more clock signals, and other signals (e.g., a chip enable signal and a write enable signal) to indicate which operation (e.g., read, write, or erase operation) is being performed. Memory control unit 418 can include data buffers 426 to receive data at the communication interface from the host device 402. The memory control unit 418 can also include flash control logic circuitry 428 to write data to the memory array 401. The flash control logic circuitry 428 may perform functions related to distributing the data among the memory cells.

In addition to erase operations, the memory control unit 418 can perform discard operations and purge operations. The discard operation is a non-secure variant of the erase function. The memory control unit 418 may map virtual or logical memory addresses to the physical memory cells of the memory array. The discard operation unmaps the virtual memory from the physical memory. The distinction between discard and erase is the behavior of the memory device. In discard, the memory device is not required to guarantee that a host would not retrieve the original data from one or more logical block addresses (LBAs) that were marked for discard when a read operation is directed to the LBAs.

The purge operation operates on unmapped address space and results in removing all the data from the unmapped address space. This is done according to a parameter value set inside the memory device. This parameter value may be set to reflect that information will be removed using a vendor defined mechanism (e.g., an erase mechanism). The purge operation can be a very lengthy process which depends on the number of unmapped regions, their size and their location.

Unlike the discard operation where the device should guarantee that a host would not retrieve the original data from one or more LBAs that were marked for discard when a read operation is directed to the LBAs, the purge operation removes the data from the unmapped space in a more secure manner, such as by physically erasing the data in the memory array 401. In some embodiments, the memory control unit 418 transfers a specified purge data pattern instead of read data to the host via the communication interface when the portion of the memory cells containing the read data is a purged portion of memory cells of the memory array. For example, the memory control unit 418 may transfer all zeros or all ones to the host device 402 as the specified purge data pattern.

The memory control unit includes RCAM 410. The memory control unit 418 may generate a table or map 412 (e.g., a logical-to-physical address map) using RCAM to track unmapped LBAs when a discard command or other discard indication is received by the memory control unit 418. The map 412 may be an RCAM array, such as RCAM array 215 in FIG. 2 that stores two values for each RCAM memory element to represent ranges of LBAs in the map. The position within the map 412 may represent a region that is to be unmapped within the drive. When a logical-to-physical (L2P) map load occurs for that region, the unmapping can be performed for that region once the hit is detected by the RCAM. A hit may be indicated by an address or other identifier being returned to the processor by the RCAM. Each LBA of a read access request by the host is also compared in parallel against the two values of the RCAM memory elements to see if its data has been unmapped. If the LBA is indicated to be unmapped, a purge data pattern can be returned without accessing the memory array 401. Because every LBA needs to be checked against every range, the speed provided by the RCAM helps prevent the slowing down of the memory device by the unmapping operations.

The entries in the RCAM may be used for purge operations. The unmapped regions indicated in the L2P map 412 may be purged by the memory control unit as a background operation, so the memory device is not slowed down by the purge operations. The addresses for purging may be flagged in the L2P map 412.

Figure 5:
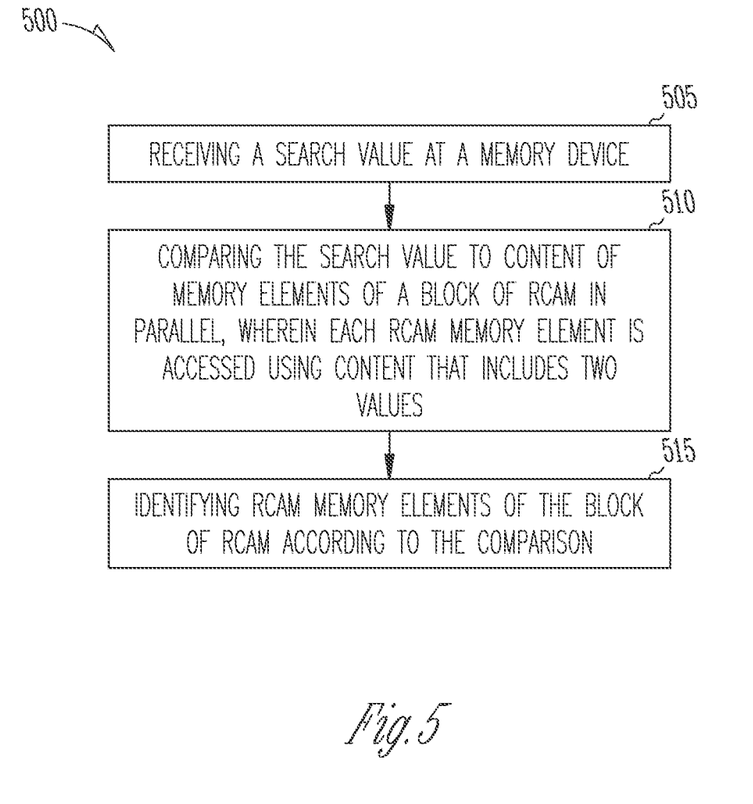
FIG. 5 is flow diagram of a method of operating a memory device.

For completeness, FIG. 5 is flow diagram of a method of operating a memory device that includes RCAM. At 505, a search value is received at the memory device. At 510, the search value is compared to content of memory elements of a block of ranged content-addressable memory (RCAM) in parallel, wherein each RCAM memory element is accessed using content that includes two values. At 515, RCAM memory elements of the block of RCAM are identified according to the comparison.

Figure 6:
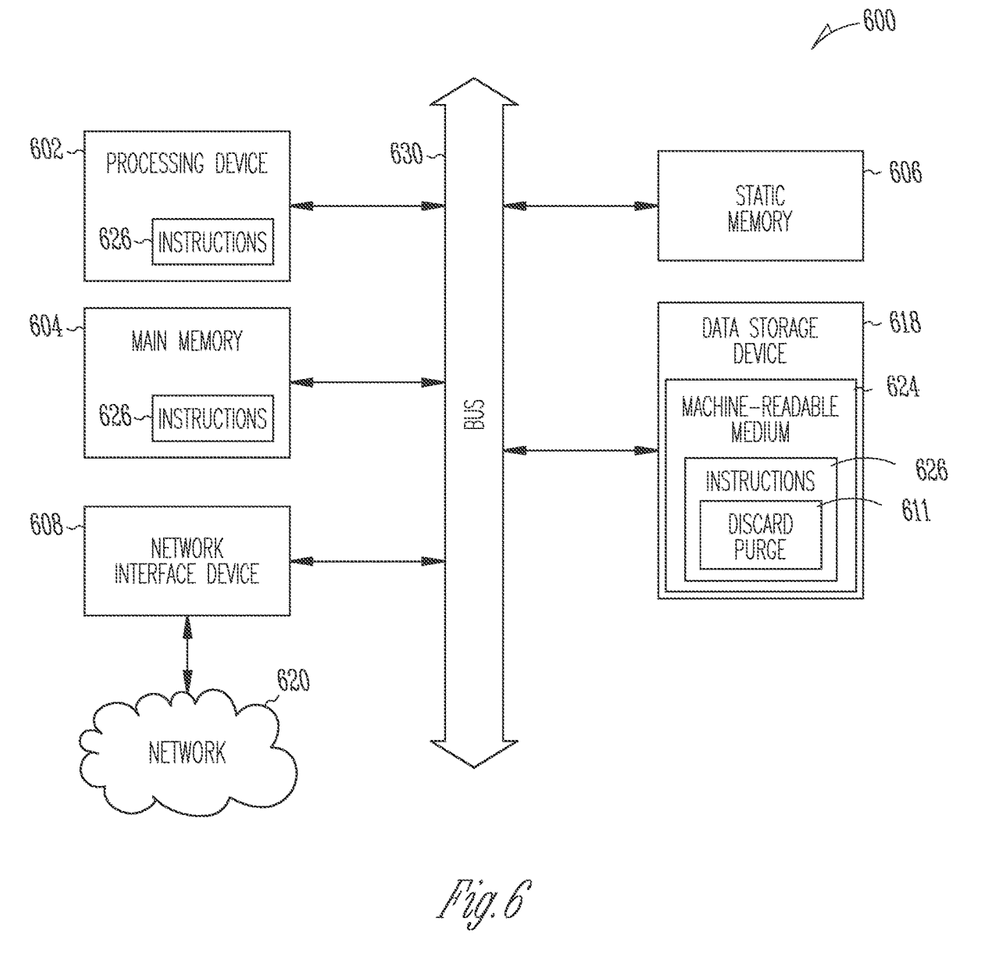
FIG. 6 illustrates a block diagram of an example machine according to some embodiments described herein.

FIG. 6 illustrates a block diagram of an example machine 600 upon which any one or more of the techniques (e.g., methodologies) discussed herein may perform, such as the described range content-addressable memory operations for example. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 600 may include a processing device 602 (e.g., a hardware processor, a central processing unit (CPU), a graphics processing unit (GPU), a hardware processor core, or any combination thereof, such as a memory control unit of the memory device, etc.), a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage system 618, some or all of which may communicate with each other via an interlink (e.g., bus) 630.

The processing device 602 can represent one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The machine 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the machine 600, the main memory 604 and the processing device 602 also constituting machine-readable storage media. In one implementation, the data storage system includes ranged content-addressable memory (RCAM) and the instructions 626 include instructions 611 to implement functionality corresponding to implementing one or both of discard and purge operations using RCAM.

While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the data storage device 618 can be accessed by the main memory 604 for use by the processing device 602. The main memory 604 (e.g., DRAM) is typically fast, but volatile, and thus a different type of storage than the data storage device 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the data storage device 618 can be allocated to supplement the main memory 604; however, because the data storage device 618 device is typically slower than the main memory 604, and write speeds are typically at least twice as slow as read speeds, use of virtual memory can greatly reduce user experience due to storage device latency (in contrast to the main memory 604, e.g., DRAM). Further, use of the data storage device 618 for virtual memory can greatly reduce the usable lifespan of the data storage device 618.

In contrast to virtual memory, virtual memory compression (e.g., the Linux™ kernel feature "ZRAM") uses part of the memory as compressed block storage to avoid paging to the data storage device 618. Paging takes place in the compressed block until it is necessary to write such data to the data storage device 618. Virtual memory compression increases the usable size of the main memory 604, while reducing wear on the data storage device 618.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to selectively reduce the operating rate of one or more components to reduce active power. The memory device control circuitry (e.g., control logic) may be programmed to slow the clock signal provided to the components in response to determining the type of memory accesses (e.g., memory usage patterns) that are being performed by the memory access device.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

ADDITIONAL DESCRIPTION AND EXAMPLES

Example 1 includes subject matter (such as a memory device) comprising a block of ranged content-addressable memory (RCAM) including multiple RCAM memory elements, wherein each RCAM memory element is accessed by content that includes two values; a search register configured to store a search value; and logic circuitry coupled to the multiple content-addressable memory elements and the search register. The logic circuitry is configured to compare the search value of the search register to the two values of each of the multiple RCAM memory elements in parallel; and identify an RCAM memory element according to the comparison.

In Example 2, the subject matter of Example 1 optionally includes the two values of an RCAM memory element including a lower bound value and an upper bound value. The logic circuitry is configured to return an address of an RCAM memory element for which the search value is included in a range determined by the lower bound value and the upper bound value of the RCAM memory element.

In Example 3, the subject matter of Example 1 optionally includes the two values of an RCAM memory element are a base value and an offset value. The logic circuitry is configured to return an address of an RCAM memory element for which the search value is included within a range of values determined by the base value and the offset value of the RCAM memory element.

In Example 4, the subject matter of one or any combination of Examples 1-3 optionally includes logic circuitry configured to identify an RCAM memory elements by one of an address of the RCAM memory element or an index into the block of RCAM that identifies the RCAM memory element.

In Example 5, the subject matter of one or any combination of Examples 1-4 optionally includes a memory control unit configured to maintain a logical-to-physical address map for physical addresses corresponding to a memory array separate from the RCAM, wherein the two values of the multiple RCAM memory elements correspond to ranges of the logical-to-physical address map.

In Example 6, the subject matter of Example 5 optionally includes a memory control unit configured to unmap a region of the logical-to-physical address map indicated by the two values of the identified RCAM memory element.

In Example 7, the subject matter of one or both of Examples 5 and 6 optionally includes a memory control unit configured to return a specified value without accessing the memory array in response to a request to an address of the region of the logical-to-physical address map indicated by the two values of the identified RCAM memory element.

In Example 8, the subject matter of one or any combination of Examples 5-7 optionally includes a memory control unit is configured to flag the region of the logical-to-physical address map indicated by the two values of the identified RCAM memory element and purge contents of the corresponding physical addresses as a background operation of the memory device.

Example 9 includes subject matter (such as a method of operating a memory device, or a computer readable storage medium including instructions that when executed by a processor or control unit of the memory device causes the memory device to perform the method), comprising receiving a search value at the memory device; comparing the search value to content of memory elements of a block of ranged content-addressable memory (RCAM) in parallel, wherein each RCAM memory element is accessed using content that includes two values; and identifying RCAM memory elements of the block of RCAM according to the comparison.

In Example 10, the subject matter of Example 9 optionally includes the two values of an RCAM memory element are a lower bound value and an upper bound value. The identifying memory elements further includes returning an address of an RCAM memory element for which the search value is included in a range determined by the lower bound value and the upper bound value of the RCAM memory element.

In Example 11, the subject matter of Example 9 optionally includes the two values of an RCAM memory element are a base value and an offset value. The identifying memory elements further includes returning an address of an RCAM memory element for which the search value is included within a range of values determined by the base value and the offset value of the RCAM memory element.

In Example 12, the subject matter of one or any combination of Examples 9-11 optionally includes maintaining a logical-to-physical address map for physical addresses corresponding to a NAND memory array separate from the RCAM, wherein the two values of the multiple RCAM memory elements correspond to ranges of the logical-to-physical address map.

In Example 13, the subject matter of Example 12 optionally includes unmapping a region of the logical-to-physical address map indicated by the two values of the identified RCAM memory element.

In Example 14, the subject matter of one or both of Examples 12 and 13 optionally includes returning a specified value to a requesting device without accessing the memory array in response to a request to access an address of the region of the logical-to-physical address map indicated by the two values of the identified RCAM memory element.

In Example 15, the subject matter of one or any combination of Examples 12-14 optionally includes flagging the region of the logical-to-physical address map indicated by the two values of the identified RCAM memory element; and purging contents of the corresponding physical addresses as a background operation of the memory device.

In Example 16, the subject matter of one or any combination of Examples 9-15 optionally includes returning addresses of the RCAM memory elements identified based on results of the comparison.

In Example 17, the subject matter of one or any combination of Examples 9-16 optionally includes returning an index into the RCAM from a base address to identify a range of memory elements determined according to results of the comparison.

Example 18 includes subject matter (such as an electronic system) or can optionally be combined with one or any combination of Examples 1-17 to include such subject matter, comprising a ranged content-addressable memory (RCAM) device and a processor. The RCAM device includes multiple RCAM memory elements, wherein each RCAM memory element is accessed using content including two values that indicate a range of values; a search register configured to store a search value; and logic circuitry coupled to the multiple RCAM elements and the search register. The processor is configured to place a search value in the search register of the RCAM device. The logic circuitry is configured to compare the search value of the search register to the two values of each of the multiple RCAM memory elements in parallel; and return an identifier of RCAM memory elements of the multiple RCAM memory elements storing content that indicates a range that includes the search value.

In Example 19, the subject matter of Example 18 optionally includes a memory array of memory cells separate from the RCAM device, wherein the processor is configured to process write and read requests to access the memory array, and store in the RCAM memory elements a logical-to-physical address map for the memory array.

In Example 20, the subject matter of Example 19 optionally includes a processor configured to purge contents of identified RCAM memory elements as part of unmapping logical addresses and physical addresses of the logical-to-physical address map.

In Example 21, any of the memory devices of Examples 1 to 8, may be adapted and operated to perform operations in accordance with any of the methods of Examples 9-17.

In Example 22, any of the memory devices of Examples 1 to 8, may be incorporated into any of the electronic systems of claims 18-20.

In Example 23 any of the methods of Examples 9-17 may be modified to include operations set forth in any other of Examples 1-8 and 18-20.

In Example 24, any of the methods of examples 9-17 may be implemented at least in part through use of instructions stored as a physical state in one or more machine readable storage devices.

In Example 25, any of the apparatuses of Examples 1-8 and 18-20 may further include a machine-readable storage device configured to store instructions as a physical state, wherein the instructions may be used to perform one or more operations of the apparatus.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:
1. A memory device comprising:
 a block of ranged content-addressable memory (RCAM) including multiple RCAM memory elements, wherein each RCAM memory element is accessed by content that includes two values;
 a search register configured to store a search value;
 logic circuitry coupled to the multiple content-addressable memory elements and the search register and configured to:
  compare the search value of the search register to the two values of each of the multiple RCAM memory elements in parallel; and
  identify an RCAM memory element according to the comparison; and
 a memory control unit configured to:
  maintain a logical-to-physical address map for physical addresses corresponding to a memory array separate from the RCAM, wherein the two values of the multiple RCAM memory elements correspond to a range of the logical-to-physical address map; and perform at least one of a mapping or unmapping operation on the range of the logical-to-physical address map.

2. The memory device of claim 1, wherein the two values of an RCAM memory element are a lower bound value and an upper bound value, and wherein the logic circuitry is configured to return an address of an RCAM memory element for which the search value is included in a range determined by the lower bound value and the upper bound value of the RCAM memory element.

3. The memory device of claim 1, wherein the two values of an RCAM memory element are a base value and an offset value, and wherein the logic circuitry is configured to return an address of an RCAM memory element for which the search value is included within a range of values determined by the base value and the offset value of the RCAM memory element.

4. The memory device of claim 1, wherein the logic circuitry is configured to identify an RCAM memory elements by one of an address of the RCAM memory element or an index into the block of RCAM that identifies the RCAM memory element.

5. The memory device of claim 1, wherein the memory control unit is configured to unsnap a region of the logical-to-physical address map indicated by the two values of the identified RCAM memory element.

6. The memory device of claim 5, wherein the memory control unit is configured to return a specified value without accessing the memory array in response to a request to an address of the region of the logical-to-physical address map indicated by the two values of the identified RCAM memory element.

7. The memory device of claim 5, wherein the memory control unit is configured to flag the region of the logical-to-physical address map indicated by the two values of the identified RCAM memory element and purge contents of the corresponding physical addresses as a background operation of the memory device.

8. A method of operating a memory device, the method comprising:
receiving a search value at the memory device;
comparing the search value to content of memory elements of a block of ranged content-addressable memory (RCAM) in parallel, wherein each RCAM memory element is accessed using content that includes two values;
identifying RCAM memory elements of the block of RCAM according to the comparison;
maintaining a logical-to-physical address map for physical addresses corresponding to a NAND memory array separate from the RCAM, wherein the two values of the multiple RCAM memory elements correspond to a range of the logical-to-physical address map; and
performing at least one of a mapping or unmapping operation on the range of the logical-to-physical address map.

9. The method of claim 8, wherein the two values of an RCAM memory element are a lower bound value and an upper bound value, and wherein the identifying memory elements further includes returning an address of an RCAM memory element for which the search value is included in a range determined by the lower bound value and the upper bound value of the RCAM memory element.

10. The method of claim 8, wherein the two values of an RCAM memory element are a base value and an offset value, and wherein the identifying memory elements further includes returning an address of an RCAM memory element for which the search value is included within a range of values determined by the base value and the offset value of the RCAM memory element.

11. The method of claim 8, wherein the performing at least one of a mapping or unmapping operation includes unmapping a region of the logical-to-physical address map indicated by the two values of the identified RCAM memory element.

12. The method of claim 11, including returning a specified value to a requesting device without accessing the memory array in response to a request to access an address of the region of the logical-to-physical address map indicated by the two values of the identified RCAM memory element.

13. The method of claim 11, including:
flagging the region of the logical-to-physical address map indicated by the two values of the identified RCAM memory element; and
purging contents of the corresponding physical addresses as a background operation of the memory device.

14. The method of claim 8, wherein identifying the RCAM memory elements includes returning addresses of the RCAM memory elements identified based on results of the comparison.

15. The method of claim 8, wherein identifying the RCAM memory elements includes returning an index into the RCAM from a base address to identify a range of memory elements determined according to results of the comparison.

16. An electronic system comprising:
a ranged content-addressable memory (RCAM) device, the RCAM device including:
multiple RCAM memory elements, wherein each RCAM memory element is accessed using content including two values that indicate a range of values;
a search register configured to store a search value; and
logic circuitry coupled to the multiple RCAM elements and the search register; and
a processor configured to place a search value in the search register of the RCAM device;
wherein the logic circuitry of the RCAM device is configured to:
compare the search value of the search register to the two values of each of the multiple RCAM memory elements in parallel; and
return an identifier of RCAM memory elements of the multiple RCAM memory elements storing content that indicates a range of RCAM memory elements that includes the search value; and
wherein the processor is configured to store in the multiple RCAM memory elements a logical-to-physical address map for the memory array and perform at least one of a mapping or unmapping operation on the indicated range of RCAM memory elements.

17. The electronic system of claim 16, including a memory array of memory cells separate from the RCAM device, wherein the processor is configured to process write and read requests to access the memory array.

18. The electronic system of claim 16, wherein the processor is configured to purge contents of identified RCAM memory elements as part of unmapping logical addresses and physical addresses of the logical-to-physical address map.

* * * * *